(12) United States Patent
Bow et al.

(10) Patent No.: US 8,990,669 B2
(45) Date of Patent: Mar. 24, 2015

(54) LINEAR FEEDBACK SHIFT REGISTER WITH SINGLE BIT ERROR DETECTION

(71) Applicants: Rouh T. Bow, Rolling Hills Estates, CA (US); Philip A. Dafesh, Manhattan Beach, CA (US); Clyde E. Edgar, Jr., El Segundo, CA (US)

(72) Inventors: Rouh T. Bow, Rolling Hills Estates, CA (US); Philip A. Dafesh, Manhattan Beach, CA (US); Clyde E. Edgar, Jr., El Segundo, CA (US)

(73) Assignee: The Aerospace Corporation, El Segundo, CA (US)

( * ) Notice: Subject to any disclaimer, the term of this patent is extended or adjusted under 35 U.S.C. 154(b) by 194 days.

(21) Appl. No.: 13/829,672

(22) Filed: Mar. 14, 2013

(65) Prior Publication Data

US 2014/0281749 A1 Sep. 18, 2014

(51) Int. Cl.
*G06F 11/00* (2006.01)
*H03M 13/00* (2006.01)

(52) U.S. Cl.
CPC .................................. *G06F 11/006* (2013.01)

USPC ........................................... 714/801; 714/739

(58) Field of Classification Search
USPC ................................................. 714/739, 801
See application file for complete search history.

(56) References Cited

U.S. PATENT DOCUMENTS

| | | | |
|---|---|---|---|
| 5,271,012 A * | 12/1993 | Blaum et al. | 714/6.24 |
| 5,450,340 A | 9/1995 | Nicolaidis | |
| 6,023,783 A * | 2/2000 | Divsalar et al. | 714/792 |
| 6,430,213 B1 | 8/2002 | Dafesh | |
| 7,042,930 B2 | 5/2006 | Dafesh | |
| 7,120,198 B1 | 10/2006 | Dafesh et al. | |
| 7,130,326 B2 | 10/2006 | Bow et al. | |
| 7,200,342 B2 | 4/2007 | Dafesh | |
| 7,426,528 B2 | 9/2008 | Denk | |
| 8,046,653 B2 * | 10/2011 | Rajski et al. | 714/738 |
| 2003/0101410 A1* | 5/2003 | Betti et al. | 714/794 |
| 2007/0076826 A1* | 4/2007 | Stockmanns et al. | 375/341 |
| 2010/0253555 A1* | 10/2010 | Weingarten et al. | 341/51 |

* cited by examiner

*Primary Examiner* — M. Mujtaba K Chaudry
(74) *Attorney, Agent, or Firm* — Paul D. Chancellor; Ocean Law

(57) ABSTRACT

A linear feedback shift register machine capable of generating periodic sequences and having means for detecting single point errors in the generated sequences.

4 Claims, 12 Drawing Sheets

| 0 | 1 | 2 | 3 | 4 | Hex value (0..4) |
|---|---|---|---|---|---|
| 1 | 1 | 1 | 1 | 1 | 1F |
| 0 | 1 | 1 | 1 | 1 | 0F |
| 0 | 0 | 1 | 1 | 1 | 07 |
| 1 | 0 | 0 | 1 | 1 | 13 |
| 1 | 1 | 0 | 0 | 1 | 19 |
| 0 | 1 | 1 | 0 | 0 | 0C |
| 1 | 0 | 1 | 1 | 0 | 16 |
| 0 | 1 | 0 | 1 | 1 | 0B |
| 0 | 0 | 1 | 0 | 1 | 05 |
| 1 | 0 | 0 | 1 | 0 | 12 |
| 0 | 1 | 0 | 0 | 1 | 09 |
| 0 | 0 | 1 | 0 | 0 | 04 |
| 0 | 0 | 0 | 1 | 0 | 02 |
| 0 | 0 | 0 | 0 | 1 | 01 |
| 1 | 0 | 0 | 0 | 0 | 10 |
| 0 | 1 | 0 | 0 | 0 | 08 |
| 1 | 0 | 1 | 0 | 0 | 14 |
| 0 | 1 | 0 | 1 | 0 | 0A |
| 1 | 0 | 1 | 0 | 1 | 15 |
| 1 | 1 | 0 | 1 | 0 | 1A |
| 1 | 1 | 1 | 0 | 1 | 1D |
| 0 | 1 | 1 | 1 | 0 | 0E |
| 1 | 0 | 1 | 1 | 1 | 17 |
| 1 | 1 | 0 | 1 | 1 | 1B |
| 0 | 1 | 1 | 0 | 1 | 0D |
| 0 | 0 | 1 | 1 | 0 | 06 |
| 0 | 0 | 0 | 1 | 1 | 03 |
| 1 | 0 | 0 | 0 | 1 | 11 |
| 1 | 1 | 0 | 0 | 0 | 18 |
| 1 | 1 | 1 | 0 | 0 | 1C |
| 1 | 1 | 1 | 1 | 0 | 1E | ns $dZ_n = 0$ $dZ_n = a_6$

LINEAR FEEDBACK SHIFT REGISTER WITH SINGLE BIT ERROR DETECTION

BACKGROUND OF THE INVENTION

1. Field of the Invention

The present invention relates to counters and to pseudorandom sequence generators. In particular, the present invention relates to linear feedback shift registers used to generate pseudorandom sequences and to ancillary logic and/or operations used to detect errors that may occur in the generated sequences.

2. Discussion of the Related Art

A variety of counters and linear feedback shift registers ("LFSR") used to generate pseudorandom sequences are known. In general, a shift register with a special feedback circuit is used to generate an output sequence. Feedback circuits typically perform XOR operations on specific bits. The LFSR can circulate through ($2^n-1$) states for an n-bit register.

An n-bit LFSR is an n-bit shift register with feedback to its input. The feedback may be formed by XORing the outputs of selected stages of the shift register, referred to as 'taps,' and then inputting this to the least significant bit (stage 0). Each stage has a common clock. The 'linear' part of the term "LFSR" derives from the fact that XOR and XNOR are linear functions.

An exemplary prior art LFSR 100A is shown in FIG. 1A. As seen, there are five stages marked 0, 1, 2, 3, 4. Arranged in sequence, each stage has an input D and an output Q. Interior stages (1, 2, 3) are connected, output Q to input D. In the output stage 4, the output Q is connected both to the OUTPUT and to an XOR gate input. A second XOR gate input is the output of stage 1. The input to the input stage (stage 0, least significant bit) is feedback from the XOR gate output.

The registers of the LFSR are frequently one bit memory devices. Shown here are D flip-flop registers. The D flip-flop tracks the input, making transitions which match those of the input D. The D stands for "data"; this flip-flop stores the value that is on the data line. As seen, the result may be clocked. FIG. 1B shows a state and output table 100B for the machine of FIG. 1A.

SUMMARY OF THE INVENTION

The disclosure within includes descriptions of systems and methods for error detection in linear feedback machines.

In an embodiment, an error detection method comprising the steps of: (1) providing a finite state machine having t registers coupled together in series and operative to generate a periodic sequence of states $(s_1, s_2, \ldots, s_r), (s_1, s_2, \ldots, s_r), (s_1, s_2, \ldots, s_r), \ldots$; (2) representing the $n^{th}$ state in the sequence with a set of t state variables $s_n = a_{n1}, a_{n2}, \ldots, a_{nt}$; (3) at an initial state i, providing starting values for the t state variables $a_{i1}, a_{i2}, \ldots, a_{it}$ and for a check parity Z, computing a delta parity function $dZ_i$ as a function of a first set of zero or more of the state variables, and computing a predicted parity $NZ_i$ as ($Z_i$ XOR $dZ_i$); (4) for states in the sequence following the initial state, setting the check parity $Z_{n+1}$ equal to the predicted parity $NZ_n$, computing a state machine parity $P_{n+1}$ as sequentially XORed values of the state variables such that $P_{n+1} = (a_{(n+1)1}$ XOR $(a_{(n+1)2}$ XOR ( \ldots XOR $a_{(n+1)t}$))), and computing a total parity $T_{n+1}$ as ($P_{n+1}$ XOR $Z_{n+1}$); (5) selecting feedback to the first register, the function $dZ_i$, and the first set of state variables such that single point errors in the state of the machine are detected by total parity $T_{n+1}$.

In some embodiments, the error detection method above further includes the steps of (1) providing the first register with feedback from m registers where m varies from 1 to t such that when m=1 the feedback is from the $t^{th}$ register and when m>1 the feedback includes the $t^{th}$ register sequentially XORed with the remaining m−1 registers. And in some embodiments, the error detection method further includes step of setting $dZ_i$ equal to the sequentially XORed values of the remaining m−1 registers.

In another embodiment, an error detection method comprises the steps of providing a finite state machine operative to generate a periodic sequence of states $(s_1, s_2, \ldots, s_r), (s_1, s_2, \ldots, s_r), (s_1, s_2, \ldots, s_r), \ldots$, the finite state machine having t registers and (t−1) couplings serially connecting the registers; providing k<=(t−1) XOR gates, each gate being located in a respective coupling and each gate receiving an output from the $t^{th}$ register; representing the $n^{th}$ state in the sequence with a set of t state variables $s_n = a_{n1}, a_{n2}, \ldots, a_{nt}$; at an initial state i, providing starting values for the t state variables $a_{i1}, a_{i2}, \ldots, a_{it}$ and for a check parity $Z_i$; computing a delta parity $dZ_i$ as zero if an even number of XOR gates k else as $a_{it}$; computing a predicted parity $NZ_i$ as ($Z_i$ XOR $dZ_i$); for states in the sequence following the initial state, setting the check parity $Z_{n+1}$ equal to the predicted parity $NZ_n$, computing a state machine parity $P_{n+1}$ as sequentially XORed values of the state variables such that $P_{n+1} = (a_{(n+1)1}$ XOR $(a_{(n+1)2}$ XOR ( \ldots XOR $a_{(n+1)t}$))), and computing a total parity $T_{n+1}$ as ($P_{n+1}$ XOR $Z_{n+1}$); selecting feedback to the first register and the first set of state variables such that single point errors in the state of the machine are detected by total parity $T_{n+1}$.

Linear feedback shift registers with error detection have applications in counters and code generators used in diverse digital systems. For example, global positioning satellites utilize codes that can be and are generated by linear feedback shift register systems. Use of the systems and methods disclosed herein to detect errors in GPS related and other systems using similar technology provides a valuable means of improving the performance of these systems.

BRIEF DESCRIPTION OF THE DRAWINGS

The present invention is described with reference to the accompanying FIGS. These FIGS., incorporated herein and forming part of the specification, illustrate the invention and, together with the description, further serve to explain its principles enabling a person skilled in the relevant art to make and use the invention.

DETAILED DESCRIPTION OF THE PREFERRED EMBODIMENTS

A detailed description of the embodiments of the disclosed apparatus and method are presented herein by way of example and not limitation with reference to the figures. Although certain embodiments are shown and described in detail, it should be understood that various changes and modifications may be made without departing from the scope of the appended claims. The scope of the present disclosure will in no way be limited to the shapes thereof, the relative arrangement thereof, etc., and are disclosed simply as an example of embodiments of the present disclosure.

As a preface to the detailed description, it should be noted that as used in this specification and the appended claims, the singular forms "a," "an," and "the" include plural referents, unless the context clearly dictates otherwise.

To the extent parts, components and functions disclosed herein exchange or manipulate signals, related interconnections, couplings, and similar interfaces may be direct or indirect unless explicitly described as being otherwise limited. Notably, connected parts, components and functions may have interposed devices and/or functions as will be understood by persons of ordinary skill in the art.

The disclosure herein includes linear feedback shift registers with uses including generation of pseudorandom sequences and ancillary function(s) capable of detecting single bit errors that may occur in the generated sequence. It should be noted that where a fixed number of stages appears in an example, such is no limitation to the number of stages as shown, but merely exemplary of a particular embodiment.

Figure 1A:
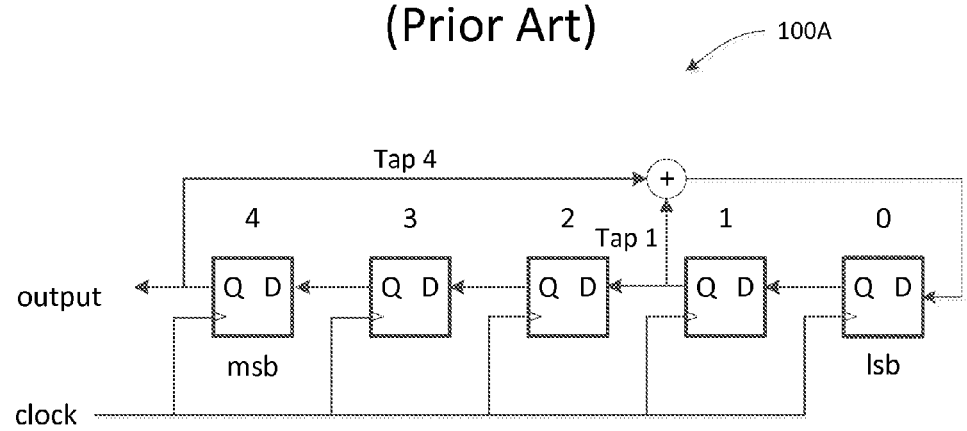
FIGS. 1A, B relate to prior art linear feedback shift register machines.
Figure 2:
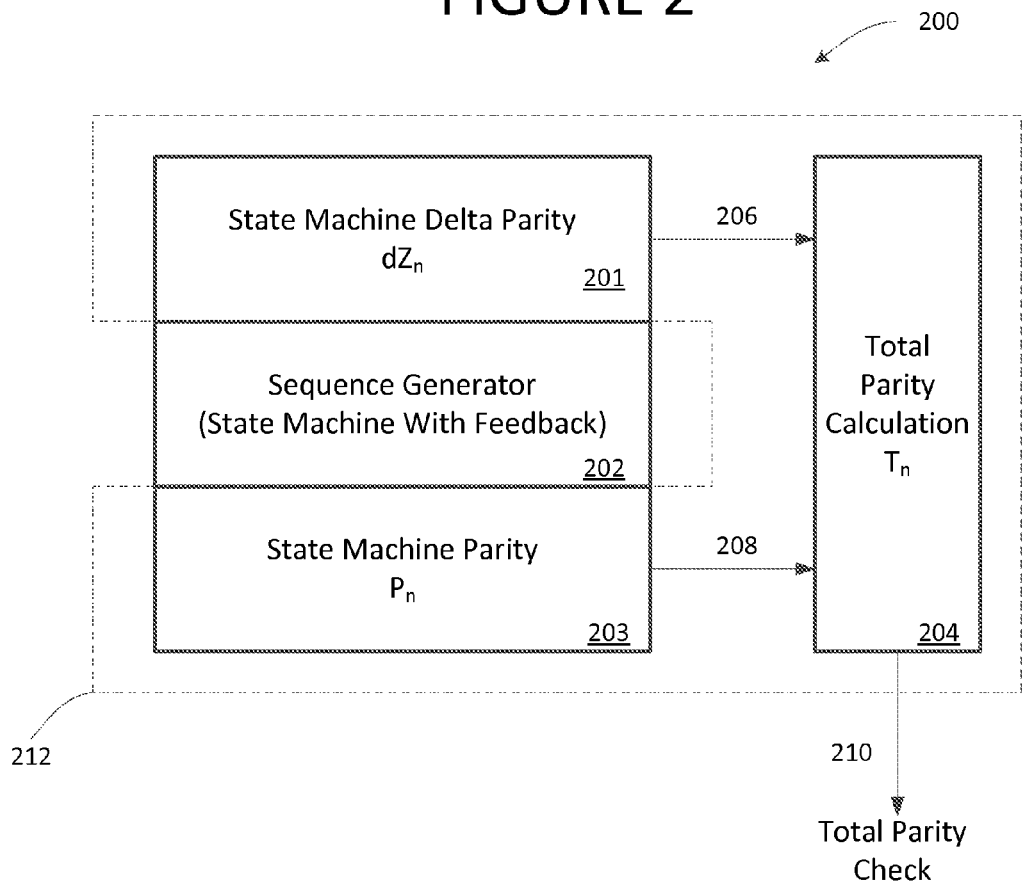
FIG. 2 shows a block diagram of a linear feedback shift register with error detection in accordance with the present invention.

Referring to the figures, FIG. 2 depicts an embodiment of a linear feedback shift register with error detection ("LFSR+") 200. An LFSR+ embodiment 200 has an LFSR 202 and ancillary functions 212. The ancillary functions include a delta parity function $dZ_n$ 201 with a delta parity output 206, a machine parity function $P_n$ 203 with a machine parity output 208, and a total parity function $T_n$ 203 with a total parity output 210. Total parity is a function of delta parity $dZ_n$ and machine parity $P_n$. And, as further described below, single bit LFSR generated sequence errors are detected by a change in total parity $T_n$.

LFSR's 202 with various configurations can be incorporated in the block diagram of FIG. 2. For example, the LFSR+ may utilize directly connected shift registers (e.g., FIG. 2) or the LFSR+ may utilize indirectly connected shift registers (e.g., FIG. 10A showing at least one indirectly connected shift register). FIGS. 3, 4A-E, and 5-8 show LFSR's with directly connected shift registers. FIG. 9 shows a generalized LFSR+ utilizing directly connected shift registers. FIGS. 10A-E show LFSRs with indirectly connected shift registers. FIG. 11 shows a generalized LFSR+ utilizing indirectly connected shift registers.

Referring now to examples of the LFSR+ with directly connected shift registers, FIGS. 3, 4A-E, and 5-8, show an embodiment that utilizes shift registers or stages 1-6.

Figure 3:
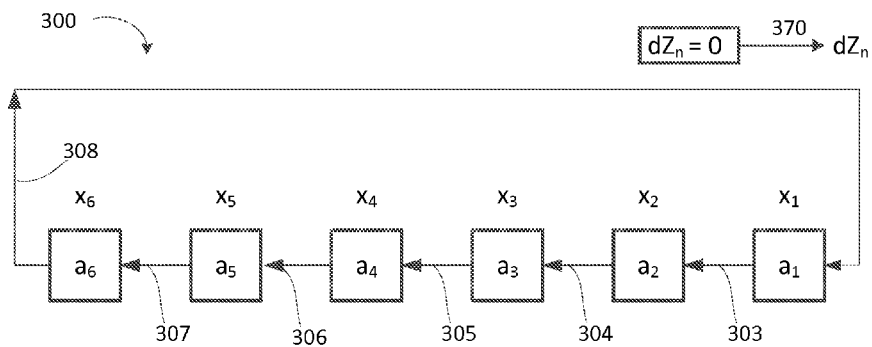
FIGS. 3, 4A-E, 5-8, and 9A,B show directly connected embodiments of the linear feedback shift register with error detection of FIG. 2.

In particular, FIG. 3 shows a simple feedback LFSR 300 with six stages $x_1$-$x_6$. Stage $x_1$ is the LFSR input stage and it holds the least significant bit a1. Stage $x_6$ is the LFSR output stage and it holds the most significant bit a6. As shown, the stages are sequentially connected 303-307 such that successive clock signals (clock not shown) cause a bit or symbol ($\psi$) to travel from one end of the LFSR to the other end where it becomes feedback to the first stage $x_1$. This process is shown in the table below.

| | STAGE | | | | | |
|---|---|---|---|---|---|---|
| Clock Signal | 1 | 2 | 3 | 4 | 5 | 6 |
| 0 | $\psi$ | | | | | |
| 1 | | $\psi$ | | | | |
| 2 | | | $\psi$ | | | |
| 3 | | | | $\psi$ | | |

| | STAGE | | | | | |
|---|---|---|---|---|---|---|
| Clock Signal | 1 | 2 | 3 | 4 | 5 | 6 |
| 4 | | | | | $\psi$ | |
| 5 | | | | | | $\psi$ |

Referring again to the block diagram of FIG. 2, the LFSR+ has an LFSR and ancillary functions including a delta parity $dZ_n$ function. FIG. 3 shows the LSFR and the delta parity $dZ_n$ function with $dZ_n$ output 370 where $dZ_n$=0 as there are no taps in this embodiment. The machine parity $P_n$ and total parity $T_n$ functions are not shown because they do not vary for the examples used to illustrate the generalized case of FIG. 9 which is discussed below. Therefore, the directly connected LFSR of FIG. 3 can be thought of as a simple feedback case void of XOR gates.

Figure 4A:
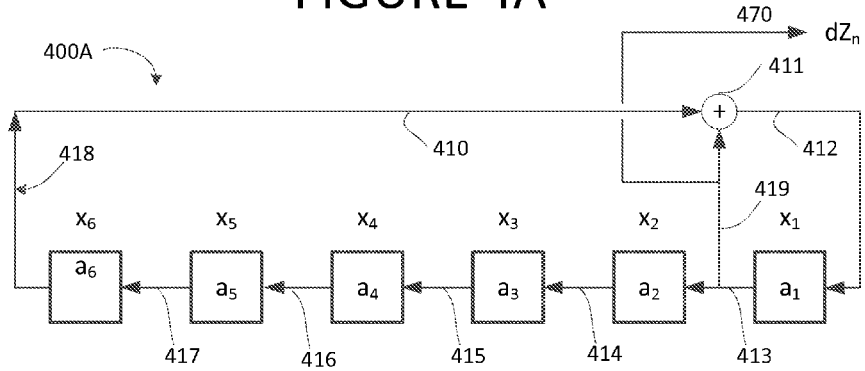

Referring to FIGS. 4A-E, the stages of FIG. 3 are repeated in an LFSR utilizing a one XOR gate feedback configuration 400A-E. In particular, FIG. 4A shows a six stage $x_1$-$x_6$ LFSR 400A with five internal interconnections 413-417. A feedback loop 418 interconnects the $x_6$ output 410 with the $x_1$ input via an XOR gate 411. XOR gate 411 inputs are the $x_6$ output and an output or tap 419 from stage $x_1$. The XOR output 412 is the feedback signal input at stage $x_1$. Here, the stage 1 tap provides the delta parity function $dZ_n$ output 470.

Figure 4B:
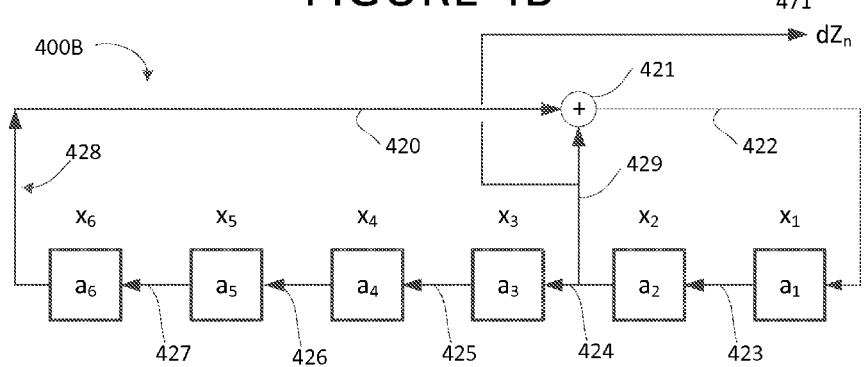

FIG. 4B shows a six stage $x_1$-$x_6$ LFSR 400B with five internal interconnections 423-427. A feedback loop 428 interconnects the $x_6$ output with the $x_1$ input via an XOR gate 421. XOR gate inputs are the $x_6$ output 420 and a tap 429 from stage $x_2$. The XOR output 422 is the feedback signal input at stage $x_1$. Here, the stage 2 tap provides the delta parity function $dZ_n$ output 471.

Figure 4C:
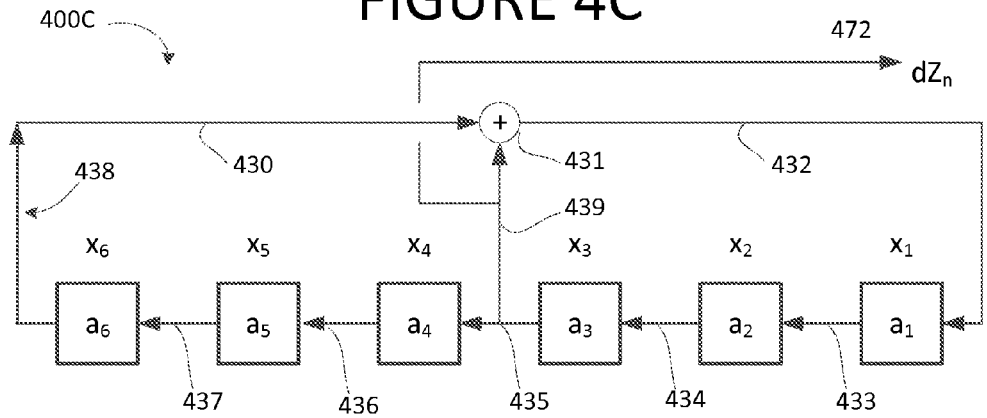

FIG. 4C shows a six stage $x_1$-$x_6$ LFSR 400C with five internal interconnections 433-437. A feedback loop 438 interconnects the $x_6$ output with the $x_1$ input via an XOR gate 431. XOR gate inputs are the $x_6$ output 430 and a tap 439 from stage $x_3$. The XOR output 432 is the feedback signal input at stage $x_1$. Here, the stage 3 tap provides the delta parity function $dZ_n$ output 472.

Figure 4D:
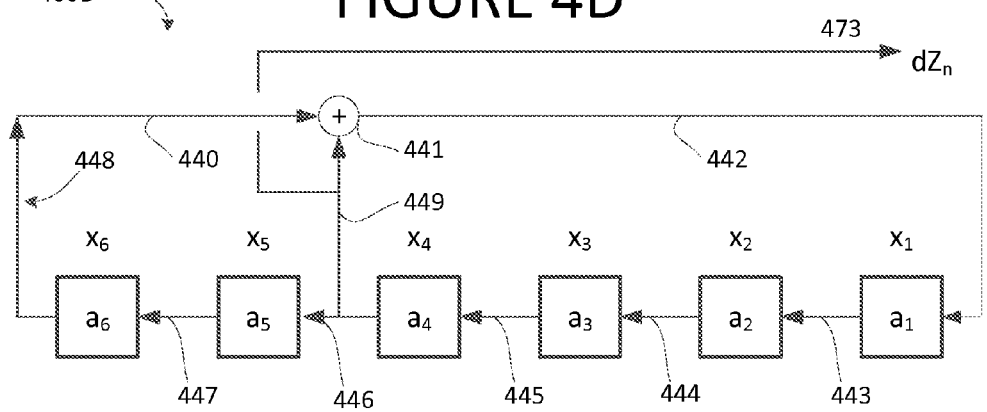

FIG. 4D shows a six stage $x_1$-$x_6$ LFSR 400D with five internal interconnections 443-447. A feedback loop 448 interconnects the $x_6$ output with the $x_1$ input via an XOR gate 441. XOR gate inputs are the $x_6$ output 440 and a tap 449 from stage $x_4$. The XOR output 442 is the feedback signal input at stage $x_1$. Here, the stage 4 tap provides the delta parity function $dZ_n$ output 473.

Figure 4E:
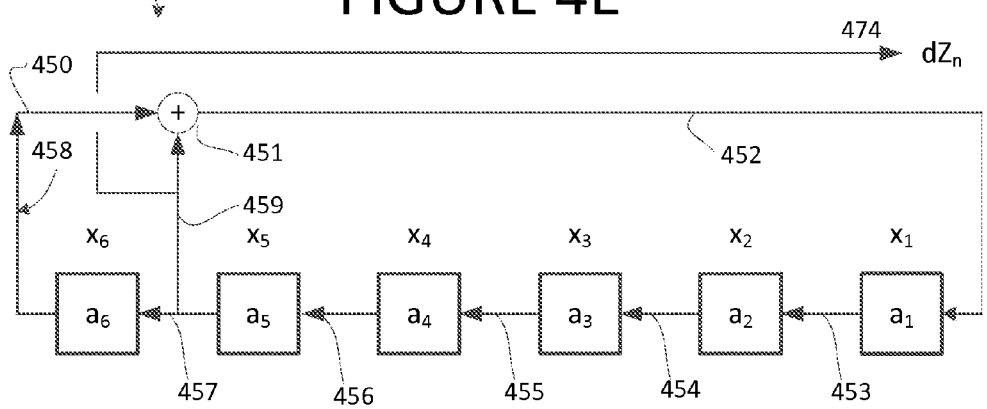

FIG. 4E shows a six stage $x_1$-$x_6$ LFSR 400E with five internal interconnections 453-457. A feedback loop 458 interconnects the $x_6$ output with the $x_1$ input via an XOR gate 451. XOR gate inputs are the $x_6$ output 450 and a tap 459 from stage $x_5$. The XOR output 452 is the feedback signal input at stage $x_1$. Here, the stage 5 tap provides the delta parity function $dZ_n$ output 474.

It is noted that FIGS. 4A-E show all possible combinations of the feedback configuration with only one XOR gate. However, FIGS. 5-8 show but a single one of the possible combinations where there are, respectively, 2, 3, 4, and 5 taps. For example, the table below illustrates all of the possible tap combinations for FIG. 5 where there are two XOR gates and two related taps. As persons of ordinary skill in the art will recognize, possible combinations equal $((n!)/(k!)*(n-k)!)$ where n is the number of stages and k is the number of taps. For FIG. 5, the result is $((5!)/(2!)*(3!))$ or ten possible combinations as shown in the table below.

| | TAPS | | | | |
|---|---|---|---|---|---|
| | 1 | 2 | 3 | 4 | 5 |
| 1 | • | • | | | |
| 2 | • | | • | | |
| 3 | • | | | • | |
| 4 | • | | | | • |
| 5 | | • | • | | |
| 6 | | • | | • | |
| 7 | | • | | | • |
| 8 | | | • | • | |
| 9 | | | • | | • |
| 10 | | | | • | • |

Figure 5:
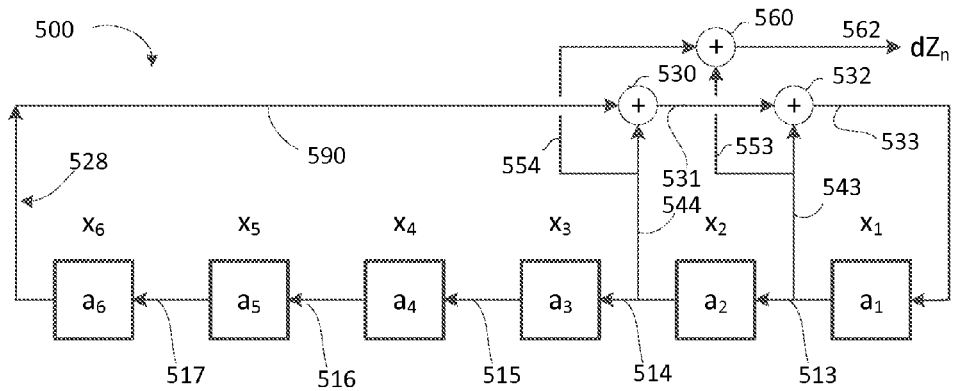

Referring to FIG. 5, the stages of FIG. 3 are repeated in an LFSR utilizing a two XOR gate feedback configuration 500. In particular, FIG. 5 shows a six stage $x_1$-$x_6$ LFSR with five internal interconnections 513-517. A feedback loop 528 interconnects the $x_6$ output with the $x_1$ input via first and second XOR gates 530, 532. The first XOR gate inputs are the $x_6$ output 590 and an $x_2$ tap 544. The second XOR gate inputs are the first XOR gate output 531 and an $x_1$ tap 543. The second XOR gate output 533 is feedback provided to the $x_1$ input.

In the two XOR gate embodiment of FIG. 5, the delta parity function also utilizes an XOR gate 560. In particular, branches 554, 553 from the $x_1$ and $x_2$ taps 543, 544 provide inputs to this delta parity XOR gate while the gate output is the delta parity function $dZ_n$ output 562.

Figure 6:
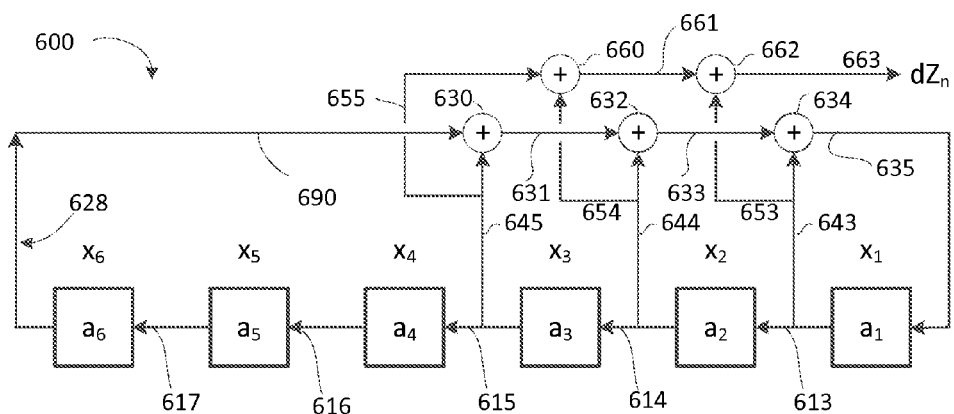

Referring to FIG. 6, the stages of FIG. 3 are repeated in an LFSR utilizing a three XOR gate feedback configuration 600. In particular, FIG. 6 shows a six stage $x_1$-$x_6$ LFSR with five internal interconnections 613-617. A feedback loop 628 interconnects the $x_6$ output with the $x_1$ input via first, second, and third XOR gates 630, 632, 633. The first XOR gate inputs are the $x_6$ output 690 and an $x_3$ tap 645. The second XOR gate inputs are the first XOR gate output 631 and an $x_2$ tap 644. The third XOR gate inputs are the second XOR gate output 633 and an $x_1$ tap 643. The third XOR gate output 635 is feedback provided to the $x_1$ input.

In the three XOR gate embodiment of FIG. 6, the delta parity function utilizes first and second delta parity XOR gates 660, 662. In particular, branches 654, 655 from the $x_2$ and $x_3$ taps 644, 645 provide inputs to the first XOR gate. Inputs of the second delta parity XOR gate are the output of the first delta parity XOR gate 661 and a branch 653 from the $x_1$ tap 643. The output of the second delta parity XOR gate 663 is the delta parity function $dZ_n$ output.

Figure 7:
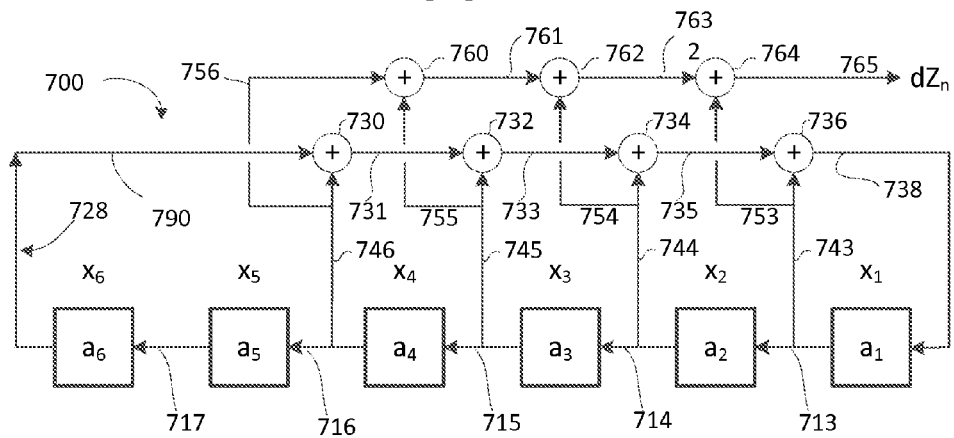

Referring to FIG. 7, the stages of FIG. 3 are repeated in an LFSR utilizing a four XOR gate feedback configuration 700. In particular, FIG. 7 shows a six stage $x_1$-$x_6$ LFSR with five internal interconnections 713-717. A feedback loop 728 interconnects the $x_6$ output with the $x_1$ input via first, second, third, and fourth XOR gates 730, 732, 734, 736. The first XOR gate inputs are the $x_6$ output 790 and an $x_4$ tap 746. The second XOR gate inputs are the first XOR gate output 731 and an $x_3$ tap 745. The third XOR gate inputs are the second XOR gate output 733 and an $x_2$ tap 744. The fourth XOR gate inputs are the output of the third XOR gate 735 and an $x_1$ tap 743. The output of the fourth XOR gate 738 is feedback provided to the $x_1$ input.

In the four XOR gate embodiment of FIG. 7, the delta parity function utilizes first, second, and third delta parity XOR gates 760, 762, 764. In particular, branches 755, 756 from the $x_3$ and $x_4$ taps 745, 746 provide inputs to the first XOR gate. Inputs of the second delta parity XOR gate are the output of the first delta parity XOR gate 761 and a branch 754 from the $x_2$ tap 744. Inputs of the third delta parity XOR gate are the output of the second XOR gate 763 and a branch 753 from the $x_1$ tap 743. The output of the third delta parity XOR gate 765 is the delta parity function $dZ_n$ output.

Figure 8:
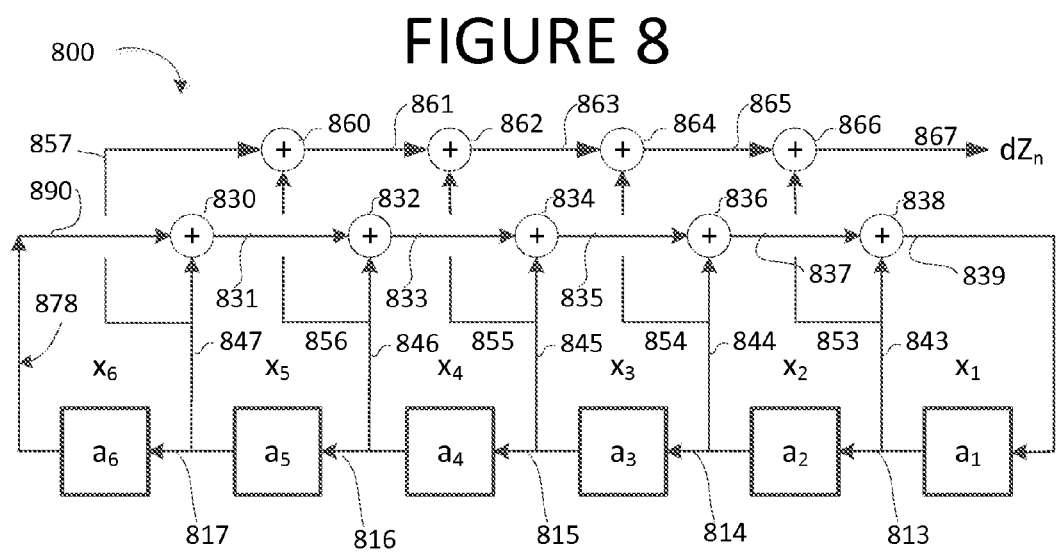

Referring to FIG. 8, the stages of FIG. 3 are repeated in an LFSR utilizing a five XOR gate feedback configuration 800. In particular, FIG. 8 shows a six stage $x_1$-$x_6$ LFSR with five internal interconnections 813-817. A feedback loop 878 interconnects the $x_6$ output with the $x_1$ input via first, second, third, fourth and fifth XOR gates 830, 832, 834, 836, 838. The first XOR gate inputs are the $x_6$ output 890 and an $x_5$ tap 847. The second XOR gate inputs are the first XOR gate output 831 and an $x_4$ tap 846. The third XOR gate inputs are the second XOR gate output 833 and an $x_3$ tap 845. The fourth XOR gate inputs are the output of the third XOR gate 835 and an $x_2$ tap 844. The fifth XOR gate inputs are the output of the fourth XOR gate 837 and an $x_1$ tap 843. The output 839 of the fifth XOR gate is feedback provided to the $x_1$ input.

In the five XOR gate embodiment of FIG. 8, the delta parity function utilizes first, second, third, and fourth delta parity XOR gates 860, 862, 864, 866. In particular, branches 856, 857 from the $x_4$ and $x_5$ taps 846, 847 provide inputs to the first XOR gate. Inputs of the second delta parity XOR gate are the output of the first delta parity XOR gate 861 and a branch 855 from the $x_3$ tap 845. Inputs of the third delta parity XOR gate are the output of the second XOR gate 863 and a branch 854 from the $x_2$ tap 844. Inputs of the fourth delta parity XOR gate are the output of the third XOR gate 865 and a branch 853 of the $x_1$ tap 843. The output of the fourth delta parity XOR gate 867 is the delta parity function $dZ_n$ output.

FIGS. 3, 4A-E, and 5-8 provide a basis for generalizing embodiments of the invention having directly connected stages.

Figure 9A:
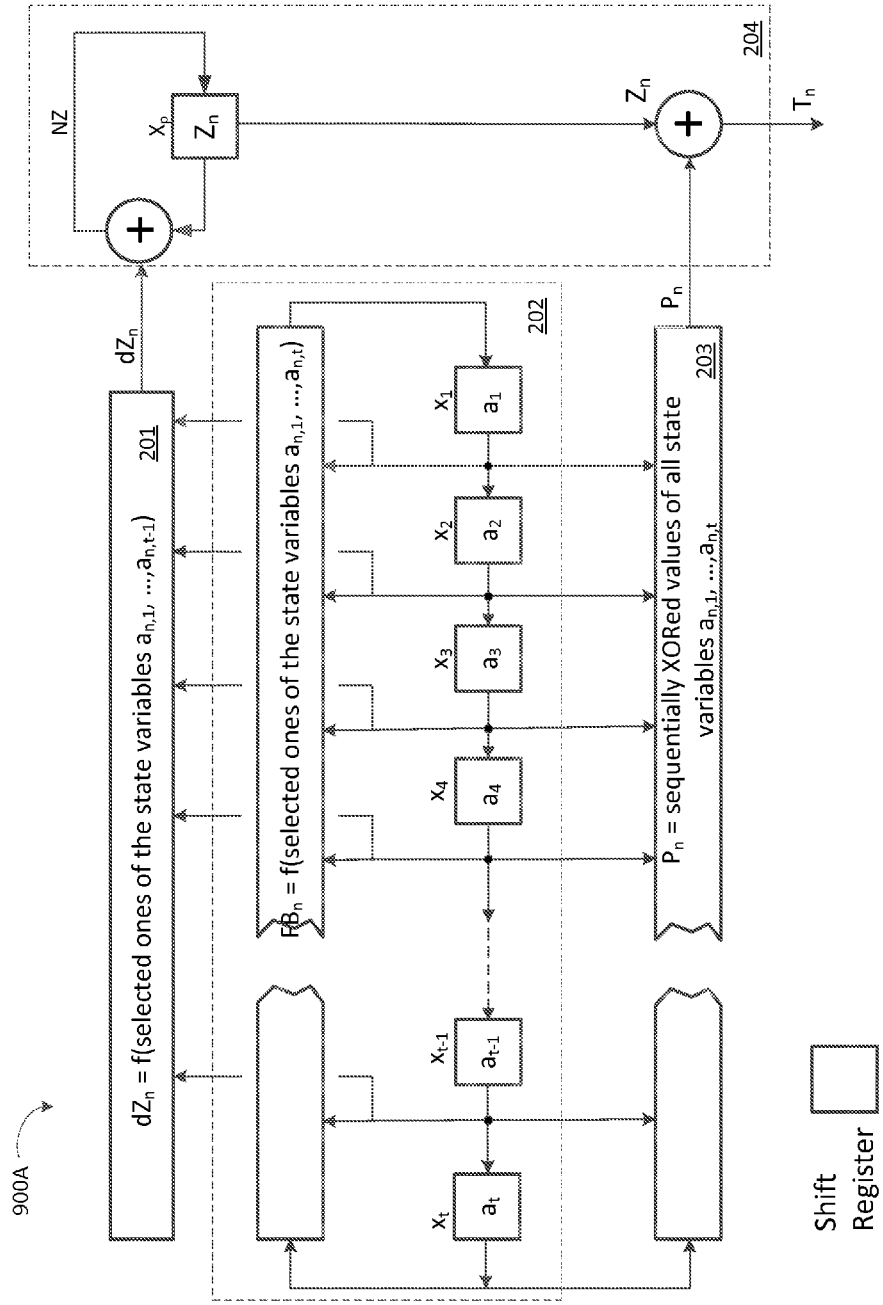
Figure 9B:
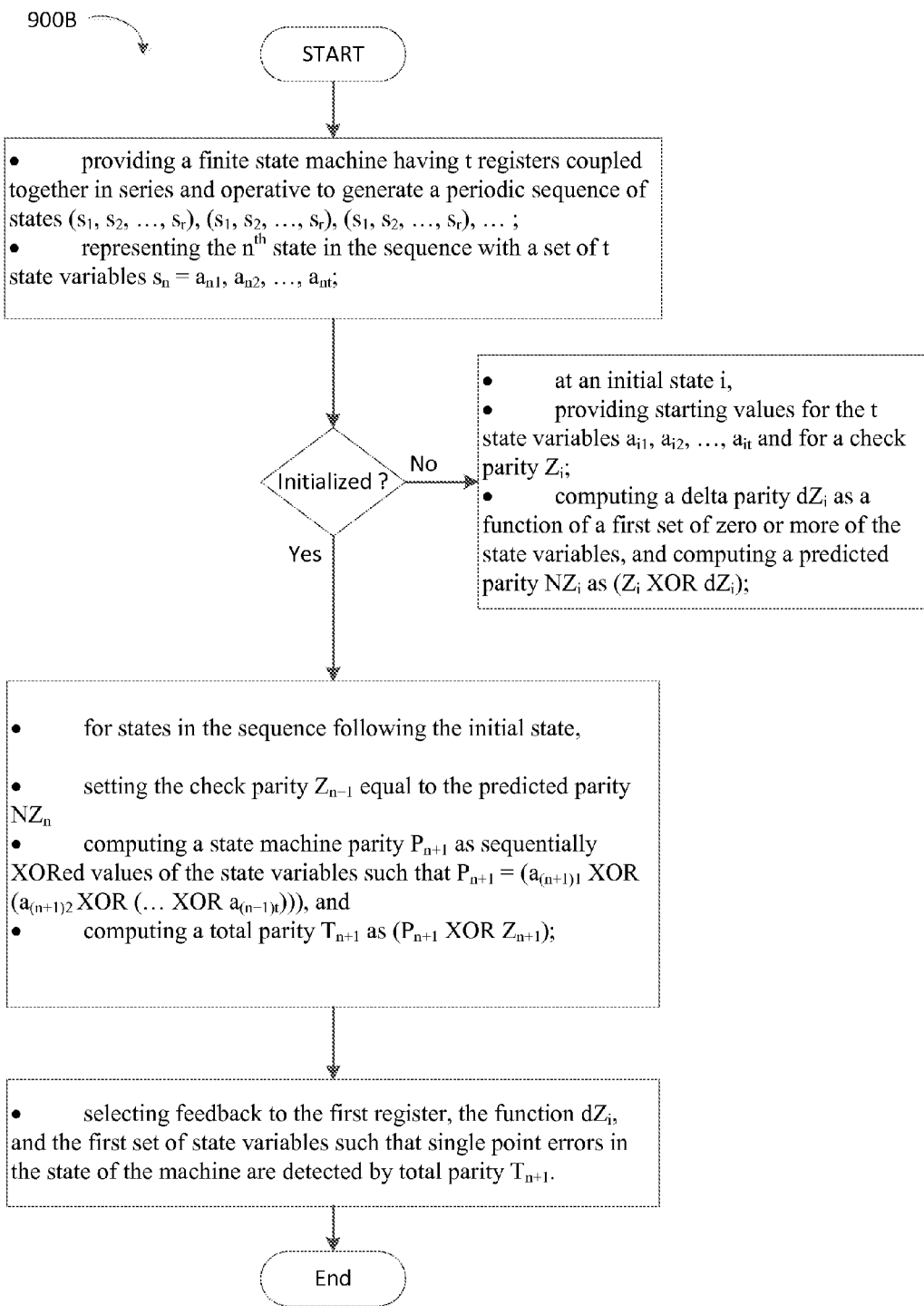
Figure 10A:
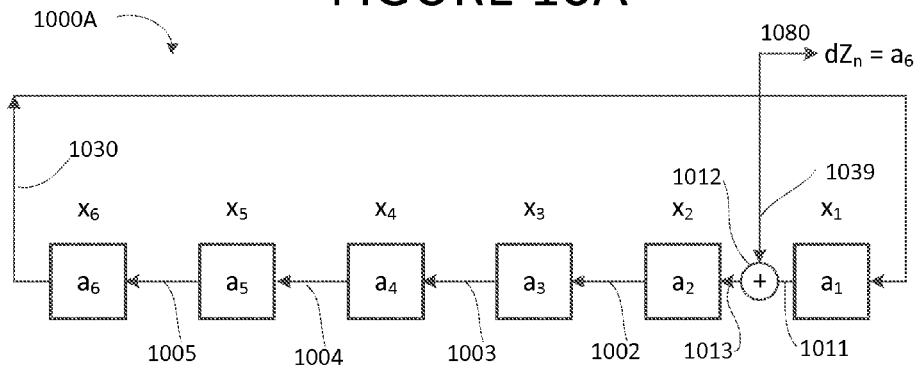
FIGS. 10A-E and 11 show indirectly connected embodiments of the linear feedback shift register with error detection of FIG. 2.

FIG. 9A shows a generalization of the LFSR+ with directly connected stages 900A and FIG. 9B shows a corresponding flowchart 900B. Here, the feedback function 202 is generalized as $$FBn = \text{a function of (selected ones of the state variables } a_{n,1}, \ldots, a_{n,t})$$

where t is the number of stages in the LFSR. The delta parity function 201 is generalized as $$dZn = \text{a function of (selected ones of the state variables } a_{n,1}, \ldots, a_{n,t-1}).$$

As mentioned above, the machine parity $P_n$ and total parity $T_n$ functions do not change with the number of registers or with the feedback selected. These functions are generalized as $$P_n = \text{sequentially } XORed \text{ values of all state variables } a_{n,1}, \ldots a_{n,t}$$

and $$T_n = Z_n XOR P_n$$

where $$NZ = dZ_n XOR Z_n$$

The flowchart 900B of FIG. 9B illustrates operation of the LFSR+ with directly connected stages. As discussed above, a finite state machine having t sequentially connected registers is provided and is operative to generate a periodic sequence of states. The $n^{th}$ state in the sequence is represented with a set of t state variables. Initialization at an $i^{th}$ state provides starting values for the t state variables and a starting value for a check parity $Z_i$. Delta parity $dZ_i$ is computed as a function of a first set of zero or more of the state variables, and a predicted parity $NZ_i = Z_i$ XOR $dZ_i$ is computed.

After initialization of the LFSR+, subsequent states in the sequence are generated by setting the check parity $Z_{n+1}$ equal to the predicted parity $NZ_n$, computing a state machine parity $P_{n+1}$ as sequentially XORed values of the state variables such that $P_{n+1}=(a_{(n+1)1}$ XOR $(a_{(n+1)2}$ XOR $(\ldots$ XOR $a_{(n+1)t})))$, and computing a total parity $T_{n+1}$ as $(P_{n+1}$ XOR $Z_{n+1})$. When feedback to the first register, the function $dZ_i$, and the first set of state variables are selected appropriately, single point errors in the state of the machine are detected by changes in total parity $T_{n+1}$. In particular, non-zero values of total parity indicate that an error has been detected.

Feedback to the first register comes from m registers where m varies from 1 to t such that: when m=1, the feedback is from the $t^{th}$ register and when m>1, the feedback includes the $t^{th}$ register sequentially XORed with the remaining m−1 registers.

Delta parity $dZ_n$ equals the sequentially XORed values of the remaining m−1 registers. And, as persons of ordinary skill in the art will understand, at initialization the first set of state variables is selected such that not all of the $a_i$ equal zero. For example, the least significant bit might be set to 1 while the remaining bits are set to zero.

Having discussed LFSR+ embodiments that utilize directly connected shift registers, we turn now to embodiments of the LFSR+ that utilize indirectly connected shift registers. FIGS. 10A-E show LFSRs with indirectly connected shift registers. FIG. 11 shows a generalized LFSR+ utilizing indirectly connected shift registers.

FIG. 10A shows a six stage $x_1$-$x_6$ LFSR 1000A with an XOR gate 1012 in the connection between stages $x_1$ and $x_2$. The remaining internal connections are direct connections 1002-1005 interconnecting stages $x_2$-$x_6$. A feedback loop 1030 interconnects the output of $x_6$ with the input of $x_1$. The XOR gate inputs are the $x_1$ output 1011 and the feedback via a first feedback branch line 1039. The $x_2$ input 1013 receives the XOR gate output. Another feedback branch line 1080 provides the delta parity function $dZ_n$ output 1080 where $dZ_n$ equals $a_6$.

Notably, for each of FIGS. 10A-E, there are a number of possible combinations that relocate the internal XOR gate(s) between different stages. As described above, each of these possible combinations is another embodiment.

Figure 10B:
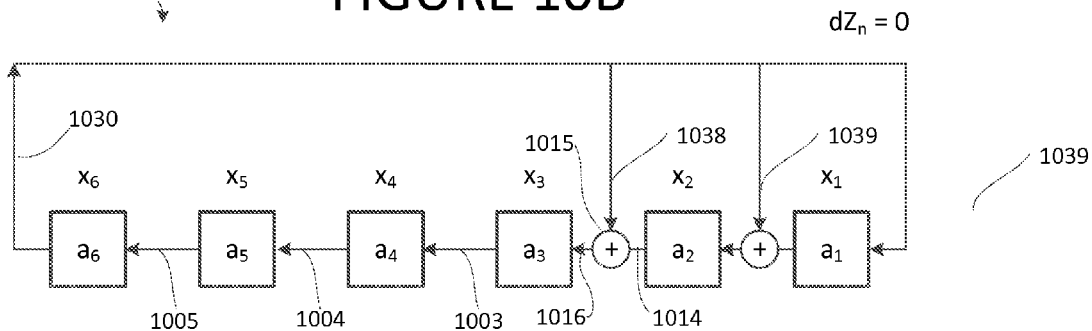
Figure 11:
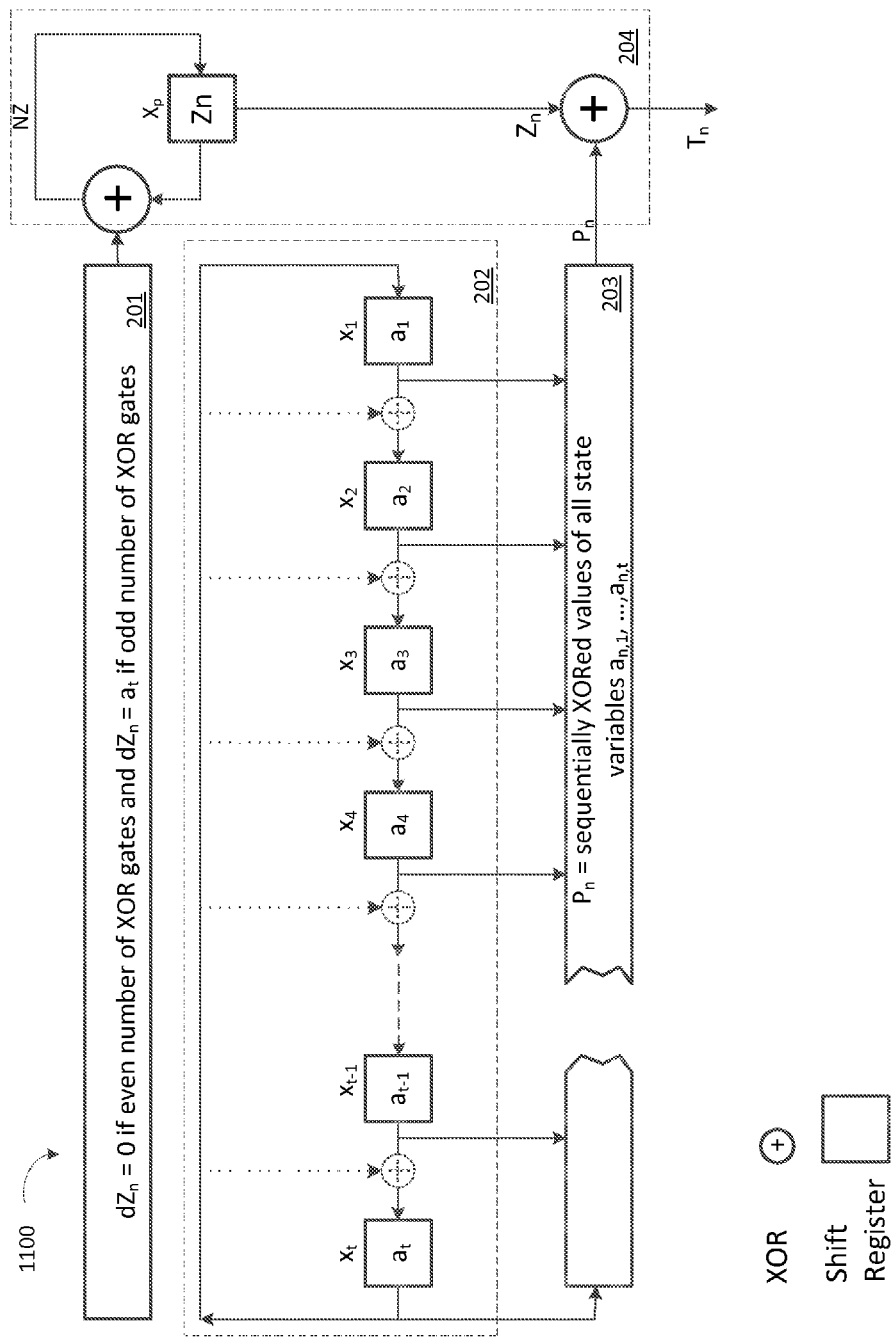

FIG. 10B shows the six stage $x_1$-$x_6$ LFSR of FIG. 10A with a second XOR gate 1015 in the connection between stages $x_2$ and $x_3$ 1000B. The second XOR gate has inputs from the $x_2$ output 1014 and the feedback via a second feedback branch line 1038. The $x_3$ input receives the second XOR gate output 1016. The delta parity function $dZ_n$ output is zero.

Figure 10C:
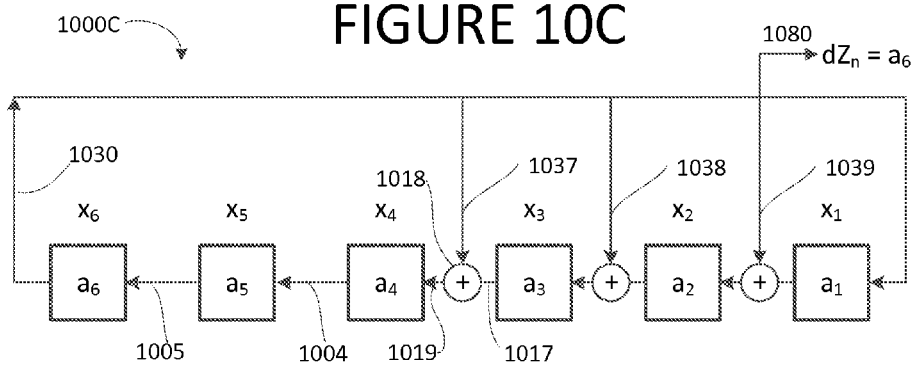

FIG. 10C shows the six stage $x_1$-$x_6$ LFSR of FIG. 10B with a third XOR gate 1018 in the connection between stages $x_3$ and $x_4$ 1000C. The third XOR gate has inputs from the $x_3$ output 1017 and the feedback via a third feedback branch line 1037. The $x_4$ input receives the third XOR gate output 1019. Another feedback branch line provides the delta parity function $dZ_n$, =$a_6$ output 1080.

Figure 10D:
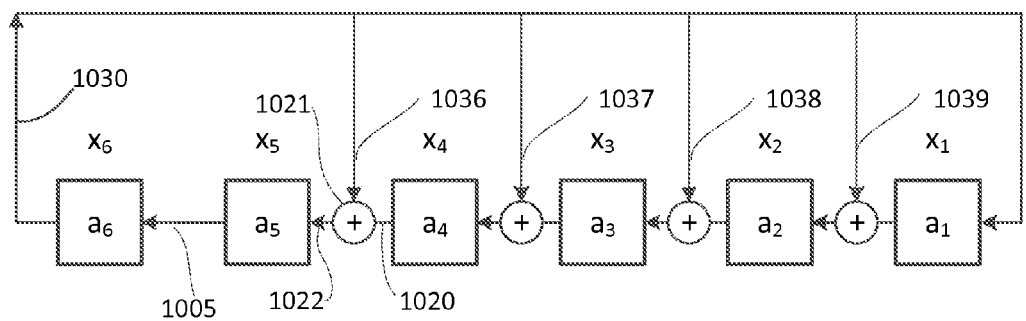

FIG. 10D shows the six stages $x_1$-$x_6$ LFSR 1000D of FIG. 10C with a fourth XOR gate 1021 in the connection between stages $x_4$ and $x_5$. The fourth XOR gate has inputs from the $x_4$ output 1020 and the feedback via a fourth feedback branch line 1036. The $x_5$ input receives the fourth XOR gate output 1022. The delta parity function $dZ_n$, output is zero.

Figure 10E:
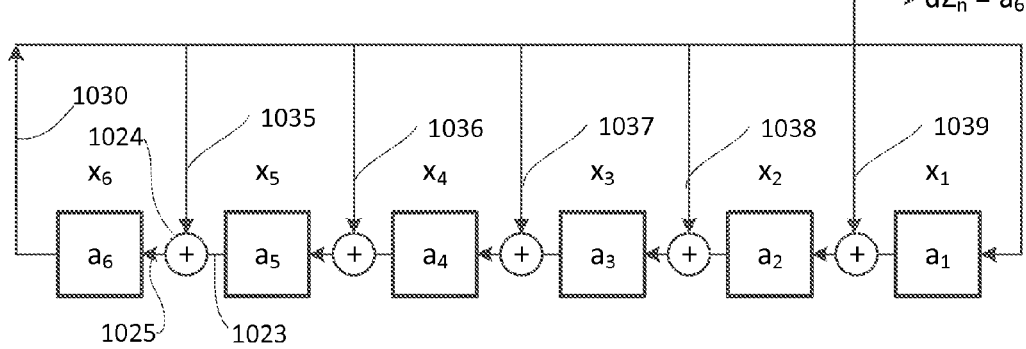

FIG. 10E shows the six stage $x_1$-$x_6$ LFSR 1000E of FIG. 10D with a fifth XOR gate 1024 in the connection between stages $x_5$ and $x_6$. The fifth XOR gate has inputs from the $x_5$ output 1023 and the feedback via a fifth feedback branch line 1035. The $x_6$ input receives the fifth XOR gate output 1025. Another feedback branch line provides the delta parity function $dZ_n$=$a_6$ output 1080.

FIGS. 10A-E provide a basis for generalizing embodiments of the invention having indirectly connected stages. FIG. 11 shows a generalization of the LFSR+ with indirectly connected stages 1100.

Generalized functions are as follows:
feedback to the first register is $a_t$,
dZn delta parity function equals zero if there is an even number of LFSR XOR gates and equals at if there is an odd number of LFSR XOR gates, $P_n$=sequentially *XORed* values of all state variables
$a_{n,1}, \ldots a_{n,t}$ and $T_n = Zn \, XOR \, P_n$ where $Zn = dZn \, XOR \, Zn$ The initialization and operation of indirectly connected embodiments of the LFSR+ device follow a similar procedure as that described for FIG. 9 above.

While various embodiments of the present invention have been described above, it should be understood that they have been presented by way of example only, and not limitation. It will be apparent to those skilled in the art that various changes in the form and details can be made without departing from the spirit and scope of the invention. As such, the breadth and scope of the present invention should not be limited by the above-described exemplary embodiments, but should be defined only in accordance with the following claims and equivalents thereof.

What is claimed is:

1. An error detection method comprising the steps of:
providing a finite state machine having t registers coupled together in series and operative to generate a periodic sequence of states $(s_1, s_2, \ldots, s_r), (s_1, s_2, \ldots, s_r), (s_1, s_2, \ldots, s_r), \ldots$;
representing the $n^{th}$ state in the sequence with a set of t state variables $s_n = a_{n1}, a_{n2}, \ldots, a_{nt}$;
at an initial state i,
providing starting values for the t state variables $a_{i1}, a_{i2}, \ldots a_{it}$ and for a check parity $Z_i$;
computing a delta parity $dZ_i$ as a function of a first set of zero or more of the state variables, and
computing a predicted parity $NZ_i$ as $(Z_i$ XOR $dZ_i)$;
for states in the sequence following the initial state,
setting the check parity $Z_{n+1}$ equal to the predicted parity $NZ_n$,
computing a state machine parity $P_{n+1}$ as sequentially XORed values of the state variables such that $P_{n+1} = (a_{(n+1)1}$ XOR $(a_{(n+1)2}$ XOR $(\ldots$ XOR $a_{(n+1)t})))$, and computing a total parity $T_{n+1}$ as $(P_{n+1}$ XOR $Z_{n+1})$; and,
selecting feedback to the first register, the function $dZ_i$, and the first set of state variables such that single point errors in the state of the machine are detected by total parity $T_{n+1}$.

2. The error detection method of claim 1 further comprising the step of:
providing the first register with feedback from m registers where m varies from 1 to t such that
when m=1 the feedback is from the $t^{th}$ register and
when m>1 the feedback includes the $t^{th}$ register sequentially XORed with the remaining m−1 registers.

3. The error detection method of claim 2 further comprising the step of setting $dZ_i$ equal to the sequentially XORed values of the remaining m−1 registers.

4. An error detection method comprising the steps of:
provinding a finite state machine operative to generate a periodic sequence of states $(s_1, s_2, \ldots, s_r), (s_1, s_2, \ldots, s_r), (s_1, s_2, \ldots, s_r), \ldots$, the finite state machine having t registers and (t−1) couplings serially connecting the registers;
providing k<=(t−1) XOR gates, each gate being located in a respective coupling and each gate receiving an output from the $t^{th}$ register;
representing the $n^{th}$ state in the sequence with a set of t state variables $s_n = a_{n1}, a_{n2}, \ldots, a_{nt}$;
at an initial state i,
providing starting values for the t state variables $a_{i1}, a_{i2}, \ldots, a_{it}$ and for a check parity $Z_i$;
computing a delta parity $dZ_i$ as zero if an even number of XOR gates k else as $a_{it}$;
computing a predicted parity $NZ_i$ as $(Z_i \text{ XOR } dZ_i)$;
for states in the sequence following the initial state,
setting the check parity $Z_{n+1}$ equal to the predicted parity $NZ_n$,
computing a state machine parity $P_{n+1}$ as sequentially XORed values of the state variables such that $P_{n+1} = (a_{(n+1)1} \text{ XOR } (a_{(n+1)2} \text{ XOR } (\ldots \text{ XOR } a_{(n+1)t})))$, and
computing a total parity $T_{n+1}$ as $(P_{n+1} \text{ XOR } Z_{n+1})$; and,
selecting feedback to the first register and the first set of state variables such that single point errors in the state of the machine are detected by total parity $T_{n+1}$.

* * * * *